(12) United States Patent
Hunter (10) Patent No.: US 7,598,784 B2
(45) Date of Patent: Oct. 6, 2009

(54) SYSTEM AND METHOD FOR CONTROLLING SIGNAL TRANSITIONS

(75) Inventor: Bradford L. Hunter, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 362 days.

(21) Appl. No.: 11/245,566

(22) Filed: Oct. 7, 2005

(65) Prior Publication Data

US 2007/0080730 A1  Apr. 12, 2007

(51) Int. Cl.
  *H03K 5/12* (2006.01)
  *H03H 11/26* (2006.01)
(52) U.S. Cl. .................. 327/170; 327/263; 327/112
(58) Field of Classification Search .............. 327/170, 327/109, 113, 172, 263, 276
  See application file for complete search history.

(56) References Cited

U.S. PATENT DOCUMENTS 5,459,422 A * 10/1995 Behrin ................. 327/276
6,222,403 B1 * 4/2001 Mitsuda ................ 327/170
6,646,480 B2 * 11/2003 Weng et al. .............. 327/99
6,714,057 B2 * 3/2004 Nguyen ................. 327/115
6,906,968 B2 * 6/2005 Kim et al. .............. 365/194
7,026,847 B2 * 4/2006 Wang et al. ............. 327/112
7,071,751 B1 * 7/2006 Kaviani ................. 327/263
7,102,407 B2 * 9/2006 Slawecki ............... 327/263
2004/0140832 A1  7/2004 Shiah

* cited by examiner

*Primary Examiner*—Dinh T. Le (57) ABSTRACT

In accordance with the present disclosure, an electronic circuit of an integrated circuit is configured to receive an input signal that has a falling transition and a rising transition and provide a selectable delay of the input signal transitions on its output. The output of the disclosed circuit can provide a falling transition delayed in response to a falling edge control signal control, and a rising transition delayed in response to a rising edge control signal. The disclosed circuit can have a rising transition control circuit (RTCC), a falling transition control circuit (FTCC) and an output circuit.

14 Claims, 5 Drawing Sheets

SYSTEM AND METHOD FOR CONTROLLING SIGNAL TRANSITIONS

FIELD OF THE DISCLOSURE

This disclosure relates generally to integrated circuits and more particularly to systems and methods for generating signal transitions.

DESCRIPTION OF THE RELATED ARTS

Background

Advances in data processing technology promote higher clock speeds, lower switching voltages and more precision in the delivery of signals to circuits. Specifically, accurate timing signals associated with read instructions or write instructions are required when a device transmits, receives, stores and displays data. If signals arrive too early or too late, a circuit can "lock up" rendering an electrical device inoperable. Some signals may be transmitted across the entire length of a semiconductor chip while other signals may only have to travel a few angstroms. Such a difference in distances can cause timing and synchronization problems within an integrated circuit. Although design tools can predict timing sequences of signals that control the operation of an integrated circuit, there is often some uncertainty as to when a signal will arrive at a particular location due to process variations, temperature variations and other considerations. After an integrated circuit is manufactured there are a limited number of remedies for correcting timing and synchronization problems. Accordingly, there is a need for controlling the timing of signals within an integrated circuit after the integrated circuit has been fabricated.

BRIEF DESCRIPTION OF THE DRAWINGS

The present disclosure may be better understood, and its numerous features and advantages made apparent to those skilled in the art by referencing the accompanying drawing, in which like reference numbers and element names indicate similar or identical items.

DETAILED DESCRIPTION OF THE DRAWINGS

Signal timing and circuit synchronization is a major concern for engineers who design integrated circuits. Creating a circuit design that has robust signal timing or even acceptable circuit synchronization is no small task and design tools that are utilized in the design of integrated circuits are not infallible. Thus, after integrated circuit devices are manufactured many of the integrated circuit devices may be inoperable due to timing problems. In accordance with a particular embodiment of the present disclosure, signal arrival times within an integrated circuit can be adjusted or modified after the integrated circuit is manufactured.

Special analysis tools can be utilized to determine when signals are arriving at specific locations within an operational integrated circuit. When timing signals and data signals are arriving too early or too late, the systems and methods of the present disclosure can utilize results from a timing analysis tool to delay signals and properly synchronize the timing of signals within the integrated circuit. The systems and methods disclosed herein can increase profits for a manufacturer by increasing the yield (saleable percentage) of manufactured integrated circuits.

In accordance with the present disclosure, an electronic circuit of an integrated circuit is configured to receive an input signal that has a falling transition and a rising transition and to provide a selectable delay of the location of the input signal's transitions on its output. The output of the disclosed circuit can provide a falling transition delayed in response to a falling edge control signal control, and a rising transition delayed in response to a rising edge control signal.

The disclosed circuit can have a rising transition control circuit (RTCC), a falling transition control circuit (FTCC) and an output circuit. An output circuit can receive and process the input signal, a delayed output transition from the RTCC, and a delayed output transition from the FTCC to provide an output signal that has delayed rising and falling transitions that are independently controlled. In a particular embodiment the RTCC and the FTCC can be disabled such that the input signal in effect "bypasses" the RTCC and the FTCC to directly toggle the output circuit to provide a "zero" delay of the input signal at its output.

Figure 1:
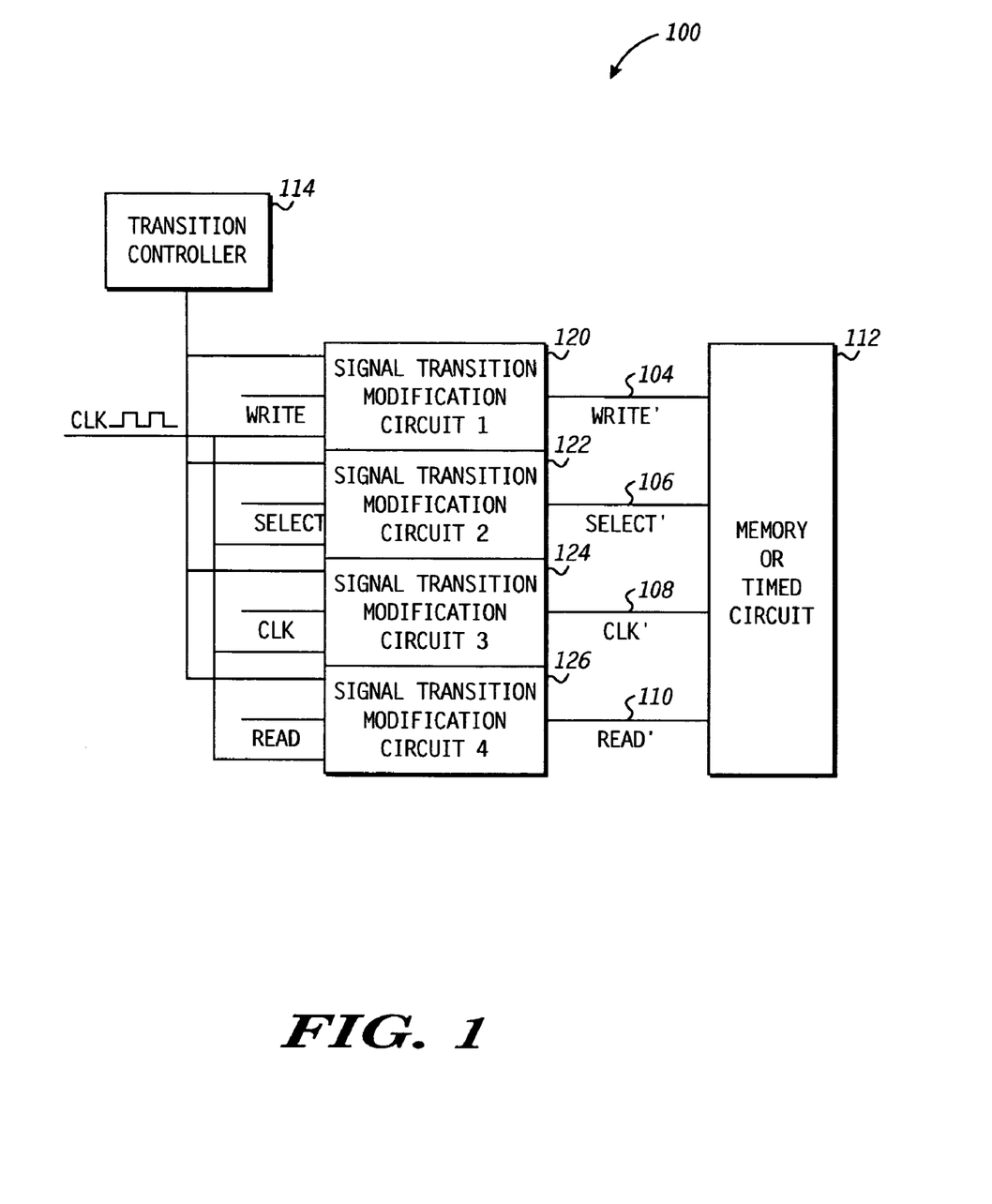
FIG. 1 is a block diagram of signal transition delay controllers that can supply signals having controlled rise and fall transitions in accordance with a specific embodiment of the present disclosure.

Referring to FIG. 1 a block diagram of a signal transition control system 100 is provided. Signal transition modification circuits (STMCs) such as first STMC 120, second STMC 122, third STMC 124, and forth STMC 126 (STMCs 120-126) can modify or delay incoming signals in response to control signals provided by the transition controller 114, and provide such modified signal transitions to time sensitive circuits 112, which can include a memory circuit. The STMCs 120-126 can accept a clock (CLK) input, input signals such as a Write, a Select, a CLK, and a Read signal and a transition control input (to control the delay) to modify or provide various transition delays for signals at the outputs of the STMC's 120-126 relative to their inputs. Specifically, a Write', a Select', a CLK', and a Read' signal can be provided on a first STMC output 104, a second STMC output 106, a third STMC output 108 and a fourth STMC output 110, respectively.

Modified signals such as a Write', Select' CLK' Read' and other signals (not shown) can be strategically controlled such that they can be utilized by the integrated circuit to synchronize circuit functions. The modified signals do not need to be a continuously transitioning or high duty cycle signal such as a clock signal, as any signal or intermittently transitioning signal such as a reset signal could be controlled by the systems and methods of the present disclosure. Thus, transitions associated with a single clock cycle or a continuous clock signal can be delayed responsive to delay control signals provided by the transition controller 114. Further, the transition controller 114 can individually or independently control the location of the rising and falling transitions of the output signal relative to the input signal.

The transition controller 114 can be programmed to provide control signals to the STMC's 120-126 such that accurate timing of clock signals can be provided to control the operation of "clocked" circuitry as represented by memory 112. In a particular embodiment, if a circuit has been fabricated and a specific portion, such as a portion of the memory needs a clock signal to arrive at an earlier time relative to other signals, the transition controller 114 can delay the other signals such that the clock signal will effectively arrive at an earlier time relative to the other signals.

The transition controller 114 can include a microprocessor for dynamically controlling the rising and falling transition of signals generated by the STMC's 120-126. For example, transition controller 114 can include registers or non-volatile memory to store an array of values provided by the microprocessor, whereby the registers can be updated during operation of a system. In another embodiment, the transition controller 114 can be a programmable logic circuit that includes non-volatile storage devices, or one time programmable devices such as a set of fuses that can be selectively burned or "blown" to provide static logic values to the STMC's 120-126. Accordingly, the programmable logic circuit can provide a fixed set of control signals to the STMC's 120-126. In a particular embodiment, once the timing of an integrated circuit design is understood, transition controllers for each integrated circuit can be "programmed" to a predetermined configuration. This predetermined configuration is selected to provide improved timing sequences for all integrated circuits manufactured in a given process.

Figure 2:
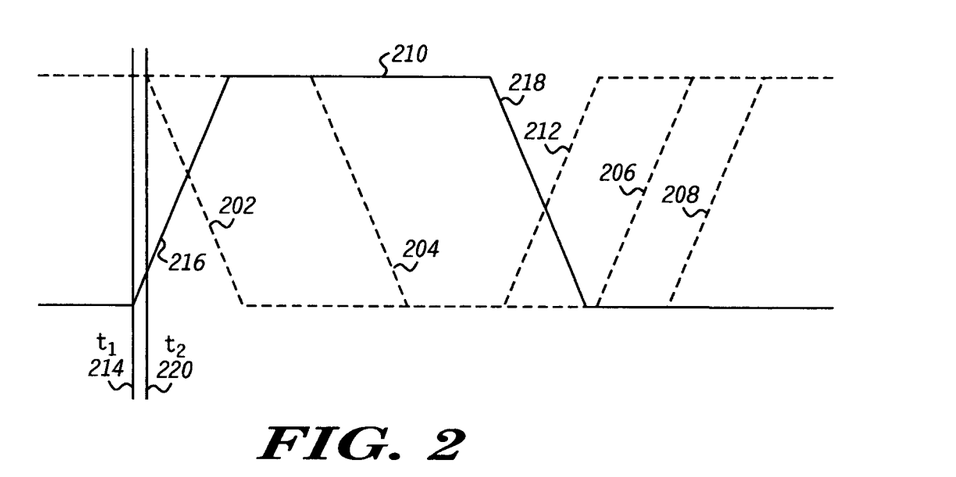
FIG. 2 is a graph depicting controlled rising and falling transitions of a clock signal.

Referring to FIG. 2 a graphical illustration 200 is provided for an input signal 210 and indications of various rising and falling transitions 202, 204, 206, 208, and 212 (transitions 202-212) based on the input signal 210 that have been delayed in accordance with the present disclosure. In the graphical illustration 200, and in accordance with embodiments described herein, the present disclosure discloses a circuit that produces a signal at its output that is inverted from the signal provided at its input. However, a non-inverting delay circuit would not part from the scope of the present disclosure.

The transition of input signal 210 of FIG. 2 is illustrated by a solid line labeled 216, while the inverted transitions that can be generated by the STMC's 120-126 of FIG. 1 are illustrated by dashed lines labeled 202-212. The STMC's can independently delay a falling transition and a rising transition of an output signal responsive to the transitions of the incoming clock signal and control signals from a transition controller.

Falling transitions 202 and 204 of FIG. 2 are produced by inverting and delaying incoming rising transition 216. Likewise, rising transitions 212, 206, and 208 illustrate inverted and delayed signals generated responsive to the incoming falling transition 218. Note that the number of possible timing delays for falling and rising transitions do not need to be the same. Locations of the transitions on the graph are described in reference to the input signal and not with reference to output signal transitions.

In operation, when a "zero delay" or "zero gate delay" is selected by a falling transition control circuit, a transition such as falling transition 202 could be provided at the output of the circuit with only a fixed amount delay, as is illustrated by the time elapsed between t1 214 and t2 220. For example, the time from t1 214 to t2 220 can represent a single transistor switching delay or a propagation delay that is minimally provided between the input transition and the output transition of a signal transition control circuit when a zero delay is selected via the control signals. Likewise, when a zero delay or zero gate delay is selected for the rising transition delay a fixed delay amount approximately equal to the time elapsed from t1 214 and t2 220 is realized. Transitions 204, 206, and 208 illustrate delays that result from one or more gate delays.

When a user desires to delay a location of a falling transition relative the input signal, the falling transition circuit can route the incoming clock signal via switches through an available number of logic gates each providing a "gate" delay. The actual time delay that can be provided by a gate depends on the technology utilized to implement the design. Utilizing 65-nanometer metallic oxide semiconductor technology a single gate delay may be approximately 20 to 30 pico seconds.

In a particular embodiment of the present disclosure, the ability to independently modify the timing of rising and falling transition of a periodic input signal allows for the duty cycle of the signal to be modified in many ways. For example, a signal transition modification circuit that receives input signal 210 and is configured to provide an output signal having a falling transition such as transition 204 and a rising transition such as 212, would provide an output signal that has a duty cycle that is reduced with respect to the duty cycle of the incoming signal.

In another embodiment, the output signal from a signal modification circuit can be configured to provide a cycle having nearly twice the duration of the incoming pulse. This can be accomplished by implementing a zero delay falling transition 202 and providing a rising transition 208 that has been delayed by multiple gate delays. Accordingly, a clock modification circuit can receive a clock pulse on its input and produce a shorter or a longer version of the clock pulse on its output. Enabling the delay circuit for small time periods and individually selecting delays for the rising and falling transitions can provide a single cycle or a pulse on the output of the circuit having less than half of the duration a clock cycle on the input of the circuit. Further, the delay circuit could provide a single cycle on its output having a very large duration (i.e. spanning many input clock cycles).

The described embodiment could be utilized when a common clock is driving different circuits and multiple clock signals with different timing sequences are required for proper circuit operation. Although the present disclosure is often described with reference to delaying clock signals, it will be appreciated that signals other than clock signal could benefit from the teachings provided herein. Thus, the circuit described herein could provide a selectable delay for any transitioning signal such as streaming digital data. The disclosed technology could also be utilized for shaping signals and controlling a duty cycle of signals for many different applications.

Figure 3:
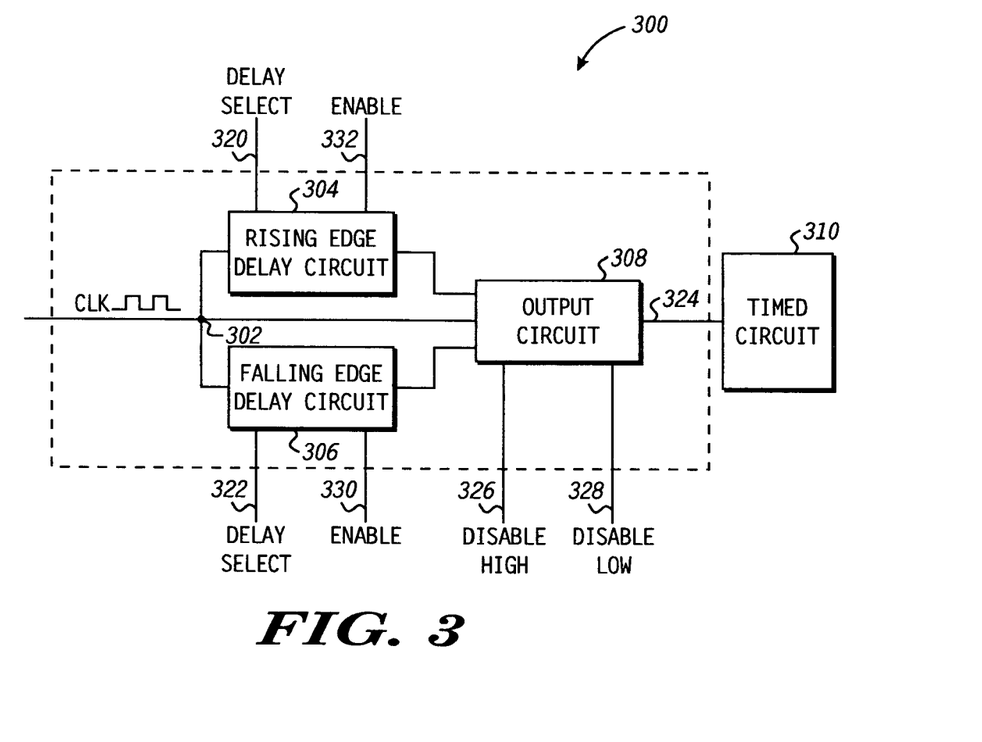
FIG. 3 depicts an illustrative circuit for providing selectable rising and falling transitions in accordance with a specific embodiment of the present disclosure.

Referring to FIG. 3, a block diagram of a signal transition modification circuit 300 is described in accordance with a specific embodiment of the present disclosure. In operation, a signal labeled CLK is received at input node 302. The input node 302 is connected to a rising transition control circuit (RTCC) 304, a falling transition control circuit (FTCC) 306, and an output circuit 308. In a particular embodiment, the output circuit 308 can be a tri-state line driver that can receive and process three signals as described herein. Specifically, the output circuit 308 can accept a rising transition indicator of the CLK signal, a falling transition indicator of the CLK signal, and the unaltered CLK signal and provide an output signal to a time sensitive circuit such as memory circuit 310. The RTCC 304 and the FTCC 306 can provide signals to the output circuit 308 that are a delayed version of the input signal. As stated above, the input signal could be a clock signal a data signal, a control signal or any other signal that can be time managed.

In operation, the RTCC 304 can receive the CLK signal, an ENABLE/DISABLE signal at node 332, and a DELAY SELECT signal at node 320, from a programmable controller or a microprocessor (not shown) and provide a delayed rising transition to the output circuit 308 based upon the DELAY SELECT and ENABLE signals. Likewise, the falling transition delay circuit 306 can receive the CLK signal, an ENABLE/DISABLE signal at node 330 and a DELAY SELECT signal at node 322 and provide a delayed falling transition indicator to the output circuit 308.

The output circuit 308 can provide a signal at the output node 324 based upon the signals received from the RTCC 304, FTCC 306, and the input node (i.e. the CLK signal). Thus, the dual transition delay control circuit 300 can generate a signal at the output node 324 that provides delayed rise and fall transitions relative to rise and fall transitions of the CLK signal. When an unaltered signal is desired at the output, (e.g., the form and duty cycle of the received signal is to remain substantially unchanged), the RTCC 304 and the FTCC 306 can send an immediate asserted or negate logic signal (not a signal related to the CLK signal) to the output circuit 308 such that the CLK signal is inverted by output circuit 308 as it passes through the output circuit 308 substantially "un-delayed." Such an un-delayed signal is also said to have a zero delay on the rising and falling transitions.

The output circuit 308 can also be controlled by a signal labeled DISABLE HIGH applied at input node 326 and a signal labeled DISABLE LOW applied at input node 328. When the DISABLE HIGH signal is asserted, the output of the output circuit 308 can rise to an asserted state and remain in an asserted state responsive to the disable high signal 326. Likewise, when the DISABLE LOW signal is active, the output of the output circuit 308 can fall to a negated state and remain in a negated state responsive to the DISABLE LOW signal. In a particular embodiment the disable signals allow the signal transition modification circuit 300 to produce an output signal having a single cycle that spans multiple clock signal transitions occurring at the input of the circuit 300.

Figure 4:
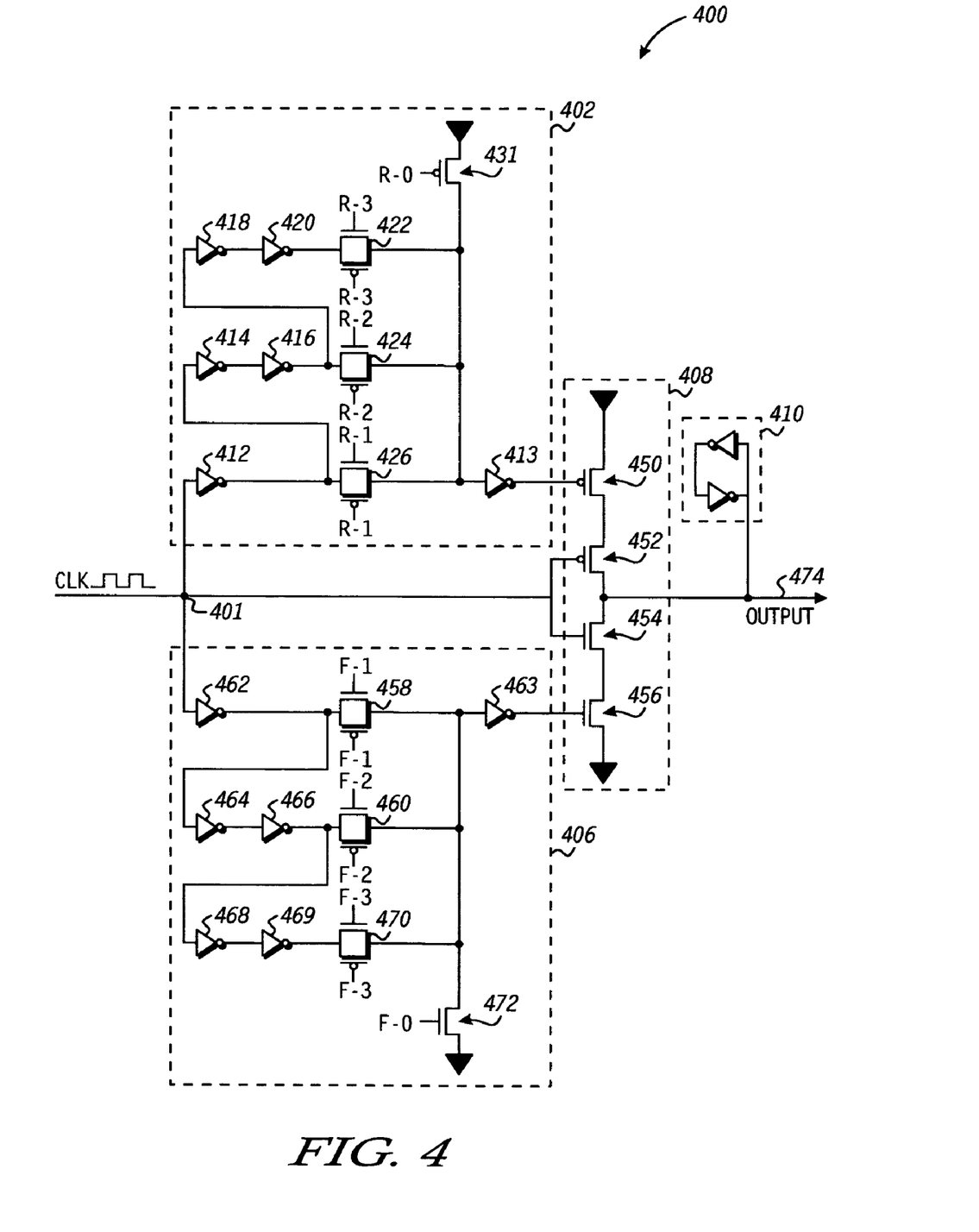
FIG. 4 illustrates an exemplary circuit for providing selectable signal transitions in accordance with a specific embodiment of the present disclosure.

Referring to FIG. 4, a schematic diagram of an exemplary signal transition modification circuit 400 is provided. The circuit is divided into functional blocks (separated by dashed lines) that include a rising transition control circuit (RTCC) 402, a falling transition control circuit (FTCC) 406, and an output circuit 408 that are functionally similar to circuits 304, 306 and 308 of FIG. 3, respectively and transmit signals over a data bus. A keeper circuit 410 can be connected to the output node 474 of the output circuit 408 to hold the output signal at a known state preventing the output voltage from drifting to an unknown voltage when output circuit 408 is in tri-state condition, such as can occur when a different number of gate delays is selected for the rising and falling transitions.

In operation, a CLK signal is received at node 401, and based on various control signal configurations applied to inputs R-0 through R-3, which correspond to the DELAY SELECT signal of FIG. 3, the RTCC 402 will produce a controllable rising signal transition to the output circuit 408. The output signal of the RTCC 402 will remain low when the timing of a rising transition relative to the CLK signal is to be delayed by a fixed amount (e.g., a zero delay), or will provide a delayed representation of signal CLK when the timing of a rising transition is to be delayed by one or multiple gate delays. Likewise, the signal provided on the output of the FTCC 406 will remain high when the timing of a falling transition relative to CLK signal is to be delayed by a fixed amount (e.g., a zero delay), or will provide a delayed representation of signal CLK when the timing of a rising transition is to be delayed by one or multiple gate delays based on control signals F-0 through F-3.

To select a zero delay rising transition at the output node 474, signal R-0 can be asserted to turn on transistor 431, which asserts transistor 450. Correspondingly, the CLK signal bypasses the delay elements of RTCC 402 allowing the CLK signal at node 401 to control transistor 452 in a manner to provide a zero delay rising signal at the output node 474.

To select a zero delay falling transition at the output node 474 signal F-0 can be asserted to turn on transistor 472 which asserts transistor 456. Correspondingly, the CLK signal bypasses the delay elements of FTCC 406 allowing the CLK signal at node 401 to control transistor 454 in a manner to provide a zero gate delay falling signal at the output node 474.

Accordingly, the RTCC 402, and the FTCC 406 can essentially be "bypassed" by the clock signal 401. Thus the input CLK signal can be provided at the output node 474 with an inconsequential delay. When a larger delay is desired, signal R-1 can be asserted to turn on transistor 426, wherein the CLK signal or a clock signal indication will incur a total of two gate delays before it reaches the output circuit 408. To provide an output signal with a total of four gate delays, signal R-2 is asserted to turn on transistor 424, thereby allowing the CLK signal to travel through four inverters before reaching the output circuit 408. Accordingly, asserting signal R-3 to turn on transistor 422 results in the CLK signal traveling through six gates or inverters before reaching the output circuit 408.

In a particular embodiment only a single control signal is active at any given time. Thus, only a single transistor that passes the signal to a gate should be activated at a particular time based on the desired delay. For example, if transistor 426 is activated, then inverters 412 and 413 will delay the CLK signal. If transistor 424 is activated the rising transition of the CLK signal will be delayed by inverters 412, 414, 416 and 413 prior to reaching the output circuit. Wherein, if transistor 422 is activated the rising transition of CLK signal will be delayed by inverters 412, 414, 416, 418, 420 and 413. Thus, in the illustrated embodiment, only a single transistor from the group of transistors 431, 422, 424 and 426 is turned on at any particular moment. Multiple switches or transistor that are simultaneously turned on can cause indeterminate values. Transistors 431, 422, 424 and 426 can operate as a low loss multidirectional metallic oxide switches to provide dual direction.

In operation the FTCC 406 can function similar to the RTCC 402. When a two gate delay is desired, signal F-1 can be asserted to turn on transistor 458, wherein the CLK signal will be delayed by two gate delays before it reaches the output circuit 408. To provide an output signal with a total of four gate delays, signal F-2 is asserted to turn on transistor 460, thereby allowing the CLK signal to travel through four inverters before reaching the output circuit 408. Accordingly, asserting signal R-3 to turn on transistor 470 results in the CLK signal traveling through six gates or inverters before reaching the output circuit 408.

As with the RTCC 402 only a single transistor from the group of transistors 458, 460, 470 and 472 within the FTTC 406 should be turned on at any given time. If both the FTCC 403 and the RTCC 406 are set to zero delay, (e.g., "disabled"), the output circuit 408 can provide a substantially "un altered" CLK signal on output node 474. Although it is referred to herein as a "zero delay" the "unaltered CLK signal" at the output of the output circuit would be delayed by at least one transistor switching delay.

Figure 5:
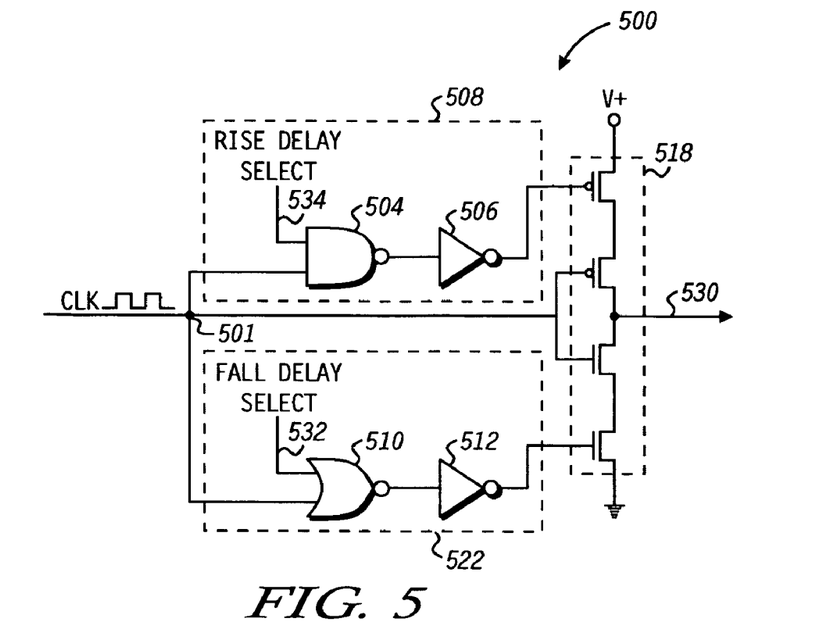
FIG. 5 depicts another exemplary circuit configured to provide selectable signal transitions in accordance with a specific embodiment of the present disclosure.

Referring to FIG. 5, an independent signal transition delay circuit (ISTDC) 500 is disclosed. The ISTC 500 is again divided up into functional blocks to provide a rising transition control circuit (RTCC) 508, a falling transition control circuit (FTCC) 522 and an output circuit 518. The ISTDC 500 can provide a zero gate delay setting and a two gate delay setting for both a rising transition and a falling transition. The RTCC 508 has a NAND gate 504 connected to the input node 501 and connected to an inverter 506 and the FTCC 522 has NOR gate coupled to the input node 501 and inverter 512.

When the RISING DELAY SELECT signal 534 is negated (e.g., logic level low), the RTCC 508 is essentially idle and a signal at the output node 530 provides a minimally delayed rising transition. A falling transition of the input signal on the input node 501 can be delayed by two gate delays when an asserted rise delay select signal is applied to the NAND gate 504.

Likewise, a rising transition of an input signal on the input node 501 can be delayed by two gate delays when a FALLING DELAY SELECT signal 532 is negated (e.g., logic level low). When the falling delay select signal 532 is at an asserted logic level, the FTCC 522 is essentially off and the signal at the output node 530 provides an output signal that is representative of the clock signal on the input node 501 with a minimal delay.

Figure 6:
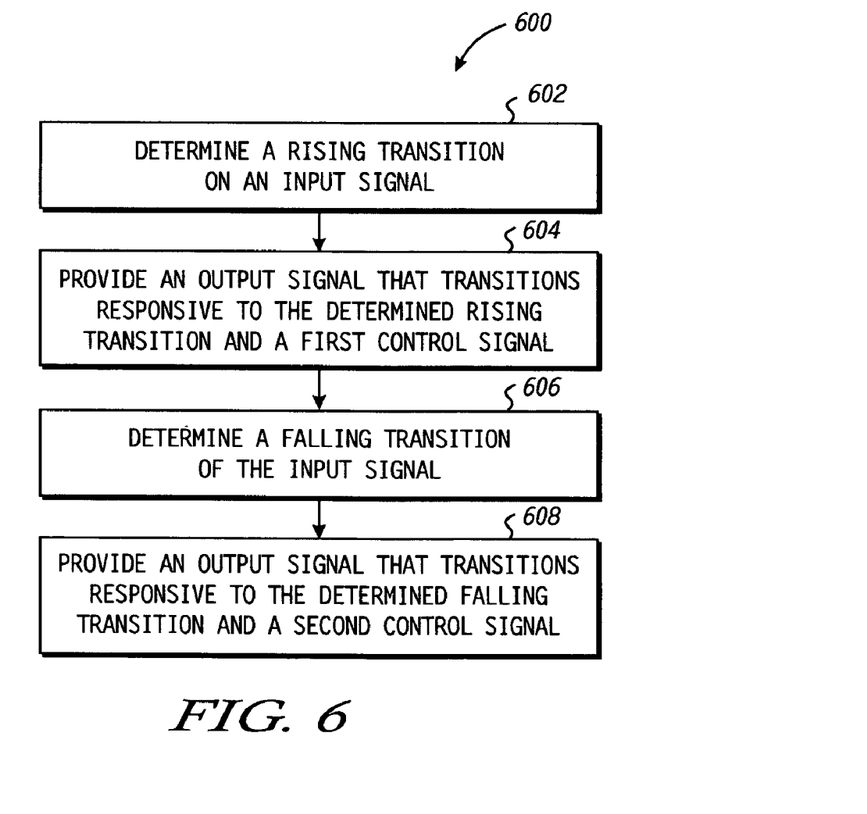
FIG. 6 is a flow diagram of a method for providing selectable signal transitions in accordance with a specific embodiment of the present disclosure.

FIG. 6 is a flow diagram 600 of a method that can be utilized to provide a clock signal having variable transition delays ranging from a zero delay to a multiple gate delay. As illustrated by block 602 a rising transition for an input signal is determined. A delayed falling transition of an output signal can be generated responsive to the determined rising transition and a rising transition delay control signal as is illustrated by block 604.

At block 606, as the input signal transitions low, a falling transition of the first signal can be determined. At block 608, a delayed rising transition of a second signal can be generated that is responsive to the determined falling transition and a falling transition control signal. The generated transitions can be combined to provide an output signal having a selected transition delays.

Figure 7:
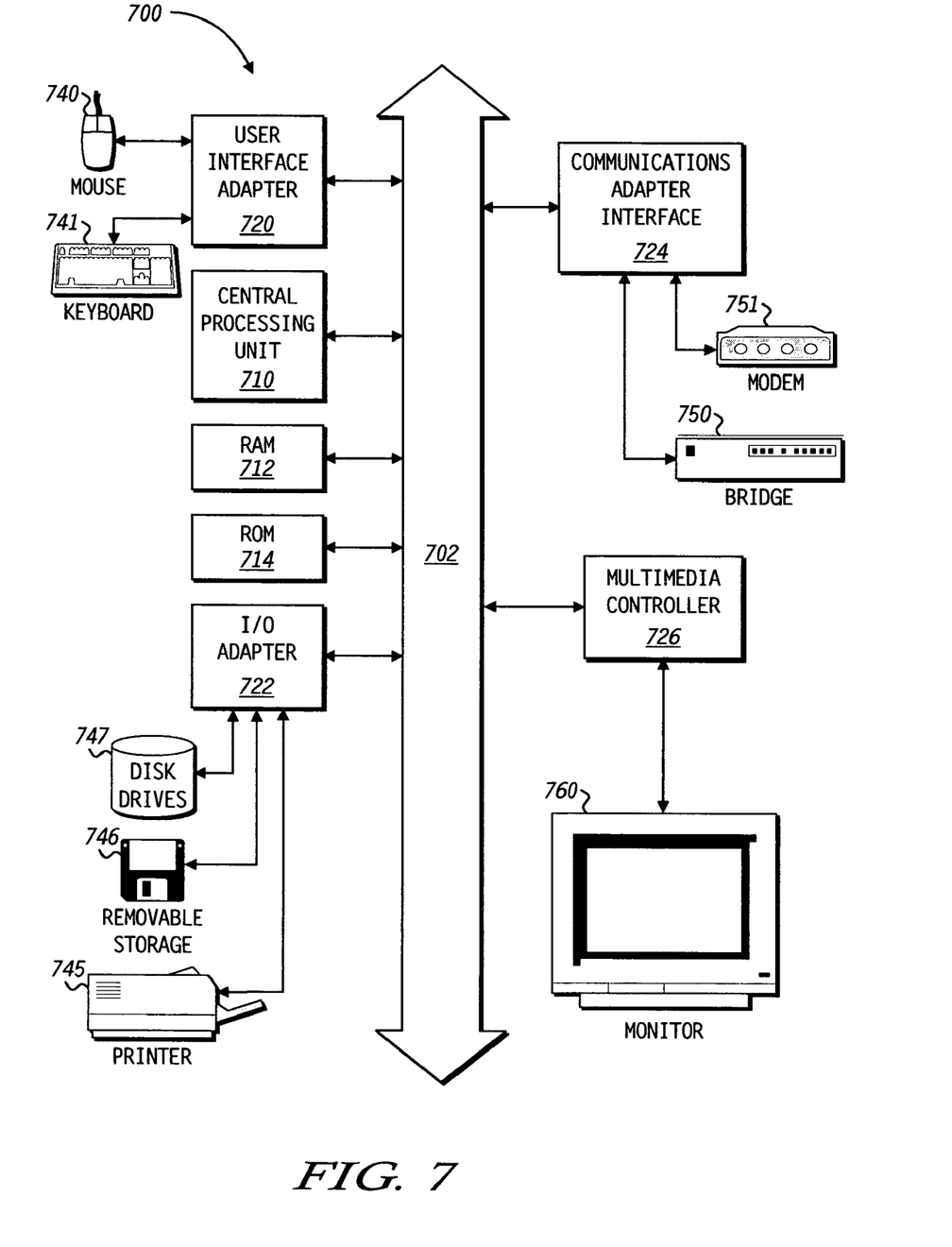
FIG. 7 illustrates a system in accordance with a specific embodiment of the present disclosure.

FIG. 7 illustrates, in a block diagram format, a processing device such as a personal computer system 700. The computer system 700 is illustrated to include a central processing unit 710, which may be a conventional proprietary data processor, memory including random access memory 712, read only memory 714, and input output adapter 722, a user interface adapter 720, a communications interface adapter 724, and a multimedia controller 726.

The input output (I/O) adapter 722 is further connected to, and controls, disk drives 747, printer 745, removable storage devices 746, as well as other standard and proprietary I/O devices. The user interface adapter 720 can be considered to be a specialized I/O adapter. The adapter 720 as illustrated is connected to a mouse 740, and a keyboard 741. In addition, the user interface adapter 720 may be connected to other devices capable of providing various types of user control, such as touch screen devices (not shown).

The communications interface adapter 724 is connected to a bridge 750 such as is associated with a local or a wide area network, and a modem 751. By connecting the system bus 702 to various communication devices, external access to information can be obtained. The multimedia controller 726 will generally include a video graphics controller capable of displaying images upon the monitor 760, as well as providing audio to external components (not illustrated). Generally, the disclosure of the present disclosure can be used within system 700, such as within the central processing unit 710, to provide improved timing of control signal It will be appreciated that future clock modification systems or future circuits with similar design challenges or issues could be implemented in accordance with the teachings herein. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

The invention claimed is:

1. An electronic circuit comprising:
   an input node coupled to receive an input signal comprising a first transition and a second transition;
   a rising transition control circuit (RTCC) comprising an input configured to receive an enable signal, an input coupled to the input node and an output to produce a first output signal in response to the enable signal being asserted, the first output signal providing a first transition in response to the first transition and a first control signal;
   a falling transition control circuit (FTCC) comprising an input configured to receive the enable signal, an input coupled to the input node and an output to produce a second output signal in response to the enable signal being asserted, the second output signal providing a second transition in response to the second transition and a second control signal; and
   an output circuit having a first input coupled to the output of the RTCC, a second input coupled to the output of the FTCC, and a third input coupled to the input node, the output circuit configured to process the first output signal first transition with the second output signal second transition and the input signal to provide an output signal having delayed transitions with respect to the first and the second transitions of the input signal.

2. The circuit as in claim 1, further comprising a keeper circuit coupled to the output circuit.

3. The circuit of claim 1 wherein the output of the RTCC provides a zero delay signal to the output circuit in response to the enable signal being negated.

4. The circuit of claim 1, wherein the output of the FTCC provides a zero delay output to the output circuit in response to the enable signal being negated.

5. The circuit of claim 1, wherein the output circuit is a tri-state line driver.

6. The circuit of claim 1, wherein the first control signal switches transistors in the RTCC, and in response to the first control signal, the RTCC provides one of a zero delay or a multiple gate delay.

7. The circuit of claim 1, wherein the second control signal switches transistors in the FTCC and in response to the first control signal, the FTCC provides one of a zero delay or a multiple gate delay.

8. The circuit of claim 1 wherein the output circuit is configured to receive a third control signal and responsive to the third control signal to drive an output of the output circuit to one of an asserted state or a negated state.

9. The circuit of claim 1, further comprising an output circuit having a first input node coupled to the RTCC, a second input node coupled to the FTCC, a third input node coupled to the input node, and an output node coupled to a memory circuit wherein the output circuit is configured to provide a delayed version of the input signal to the memory circuit.

10. The circuit of claim 1, further comprising a programmed fusible link coupled to the RTCC to provide an output signal to control the RTCC.

11. The circuit of claim 1, further comprising a programmed fusible link coupled to the FTCC to provide an output signal to control the FTCC.

12. An integrated circuit device comprising:
- an input node configured to receive an input signal having a rising transition and a falling transition;
- a rising transition delay circuit having a NAND gate and an inverter, the NAND gate having an input coupled to the input node and an output coupled to an inverter, the inverter having an output;
- a falling transition delay circuit having a NOR-gate and an inverter, the NOR gate having an input coupled to the input node and an output coupled to an inverter, the inverter having an output; and
- a tri-state line drive circuit having a first input coupled to the output of the rising transition delay circuit, a second input coupled to the input node, and a third input coupled to the output of the falling transition delay circuit and an output node configured to provide an output signal having a falling transition that can be selectively delayed with respect to the rising transition of the input signal and having a rising transition that can be selectively delayed with respect to the falling transition of the input signal.

13. The circuit of claim 1, wherein a falling transition of the output signal is delayed with respect to a falling transition of the input signal by an amount substantially equal to a single transistor switching delay.

14. The circuit of claim 1, wherein a rising transition of the output signal is delayed with respect to a rising transition of the input signal by an amount substantially equal to a single transistor switching delay.

* * * * *